United States Patent
Huang et al.

(10) Patent No.: US 7,081,844 B1
(45) Date of Patent: Jul. 25, 2006

(54) DEVICES AND METHODS FOR CONVERTING A DIGITAL SIGNAL INTO AN ANALOG SIGNAL

(75) Inventors: Elim Huang, Cupertino, CA (US); Xun Xie, Fremont, CA (US)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 11/112,065

(22) Filed: Apr. 22, 2005
(Under 37 CFR 1.47)

(51) Int. Cl.
*H03M 1/66* (2006.01)

(52) U.S. Cl. ............. 341/144; 341/135; 341/136

(58) Field of Classification Search ........... 341/144, 341/136, 135, 120
See application file for complete search history.

(56) References Cited

U.S. PATENT DOCUMENTS

| | | | | |
|---|---|---|---|---|
| 5,600,321 A | * | 2/1997 | Wincn | 341/144 |
| 5,654,710 A | * | 8/1997 | Oh et al. | 341/136 |
| 5,909,187 A | * | 6/1999 | Ahuja | 341/136 |
| 6,329,940 B1 | * | 12/2001 | Dedic | 341/144 |
| 6,727,835 B1 | * | 4/2004 | Blankenship et al. | 341/144 |
| 6,888,482 B1 | * | 5/2005 | Hertle | 341/120 |

* cited by examiner

*Primary Examiner*—Jean Bruner Jeanglaude
(74) *Attorney, Agent, or Firm*—Farjami & Farjami LLP

(57) ABSTRACT

There is provided a digital to an analog converter (DAC) comprising a current source, a first logic circuit, wherein the first logic circuit receives a first switching signal and a low-power mode signal, a first switch controlled by the first logic circuit, wherein the first switch selectively couples the current source to a ground in response to a signal from the first logic circuit, and a second switch controlled by a second switching signal, wherein the second switch selectively couples the current source to a load in response to the second switching signal. The first switching signal and the second switching signal may be complementary and are based on a digital signal that is being converted into an analog signal. The low-power mode signal is provided to selectively switch the DAC into a lower power consumption mode.

20 Claims, 3 Drawing Sheets

DEVICES AND METHODS FOR CONVERTING A DIGITAL SIGNAL INTO AN ANALOG SIGNAL

BACKGROUND OF THE INVENTION

1. Field of the Invention

The present invention relates to devices and methods that convert digital signals into corresponding analog signals (also known as digital-to-analog converters or DACs), and more particularly, to digital-to-analog converters based on current-steering architectures.

2. Background Art

Digital-to-analog converters are commonly employed in communications systems, and various audio and video applications. DACs intended for high-speed and high-accuracy applications are typically based on current-steering architectures. A conceptual view of a current-steering DAC is illustrated in FIG. 1. To convert an N-bit digital signal $b_0, b_1 \ldots b_{N-1}$ 106 to an analog output 108, a current-steering DAC 100 may include K weighted current sources $I_0, I_1 \ldots I_{K-1}$ 102. The current from the current sources 102 may be "steered" by M switches $S_0, S_1, \ldots S_{M-1}$ 104. The digital signal 106 may control the operation of the switches 104. The number of current sources 102 and switches 104 needed to convert the N-bit digital signal 106 may depend upon the underlying architecture of a current-steering DAC. In general, neither K nor M need be equal to N, or to each other.

As shown in FIG. 1, the switches $S_0, S_1, \ldots S_{M-1}$ 104 may steer the current output from the current sources either to ground 114 through an electrical connection 110 or through a load 112. The voltage, $V_{out}$, at the output terminal 108 may be measured across the load 112, shown as a resistor. In the current-steering DAC 100 shown in FIG. 1, the conversion from digital input 106 to analog output 108 may be performed by cumulatively adding the currents from those current sources 102 whose current is being steered towards the output terminal 112 through the switches 104 based on the digital input 106.

Design of a typical current-steering DAC may be based on a binary-weighted architecture, a thermometer-coded architecture, or a combination of these two architectures. DACs designed by combining binary-weighted and thermometer-coded architectures are typically referred to as segmented DACs.

In a binary-weighted architecture, each current source may be binary-weighted to represent its corresponding data bit, i.e., each current source may provide a current that may correspond to some power of two (e.g., 1; 2, 4, 8, 16, etc.). Thus, N current sources of increasing sizes may be used to convert an N-bit digital input signal into its corresponding analog output. Because each bit of the input digital signal 106 may correspond to a particular current source, the output of a current source 102 may be directly switched by its corresponding bit in the digital input 106. As a result, such a DAC may have reduced decoding needs, making such architectures area-effective. Reduced circuitry may also lead to other benefits, such as reduced cross-talk and reduced substrate noise. However, transistor matching requirements may become an issue in DACs that convert digital signals with a large number of bits. An increase in number of input bits implies an exponentially greater difference between the sizes of current source transistors for higher bits and for lower bits. A large difference in the size of current sources may increase the chances of errors in conversion due to mismatches in device sizing. The output of such a DAC may not be monotonic. Such problems may typically arise at major bit boundaries, for example, when a most significant bit (MSB) is turning "on" and all the least significant bits (LSBs) are turning "off."

A thermometer-coded architecture may employ $2^N-1$ identical current sources to convert an N-bit binary signal. Unlike the binary-coded architecture, here an input binary bit in position N may correspond to $2^{N-1}$ current sources. And each current source may provide an output current that is equal to the amount of current that represents the LSB. Because all current sources may be identical, a thermometer-coded DAC may exhibit reduced conversion errors due to device mismatches and may have an increased likelihood of producing a monotonic output. However, the design complexity may increase significantly because of the exponential increase in the number of current sources. Increased design complexity may lead to other problems, such as a more complex decoding logic, a more complex layout, and increased cross-talk and substrate noise.

Because both the binary-weighted and the thermometer-coded architectures offer some advantages and disadvantages, for certain applications the two encoding schemes may be combined to form a segmented architecture. In a segmented architecture, some of the input bits may be converted according to the binary-weighted scheme while the remainder of the bits may be converted according to the thermometer-encoded scheme.

The current-steering DAC 100 may generally exhibit a higher power dissipation because the current sources 102 may remain "on" most the time when the DAC 100 is operating, whether or not the current is being "steered" to the load. Moreover, internal heat problems may be aggravated when many DACs are stacked together or a DAC has a high number of binary bits. High power dissipation may cause problems such as operation failure, performance degradation, low stability, and low reliability. Power dissipation is an even more critical problem because of increasing integration, shrinking geometries, and the need for DACs in portable applications that demand lower power consumption.

SUMMARY OF THE INVENTION

The present invention discloses a digital-to-analog converter that converts an input digital signal into a corresponding analog output and is capable of operating in a lower power consumption mode. The disclosed low-power DAC may be designed based on a binary-coded architecture, a thermometer-coded architecture or a segmented architecture.

In one aspect of the present invention, a DAC comprises an appropriately scaled current source, switching circuits that steer the current generated by the current source, and logic circuits that control the operation of the switching circuits.

In another aspect, the DAC may also employ buffer circuits to compensate for variations in the current and voltage levels. In yet another aspect, the logic circuits take as an input a low-power mode signal and two switching signals and generate output signals that control the switching circuits, where the switching signals are based on the input digital signal being converted. The low-power mode signal controls whether the low-power DAC is operating in a lower power consumption mode. The low-power mode signal may be controlled by a user. Alternately, the low-power mode signal may also be based on factors such as the level of power consumption, accuracy of the conversion, speed of the conversion, or the digital signal being converted.

Other features and advantages of the present invention will be apparent from the accompanying drawings and from the detailed description that follows.

BRIEF DESCRIPTION OF THE DRAWINGS

The foregoing features and other aspects of the invention are explained in the following description taken in connection with the accompanying drawings, wherein.

DETAILED DESCRIPTION OF THE INVENTION

Various embodiments of devices, systems, and methods in accordance with the present invention will now be described with reference to the drawings.

Figure 1:
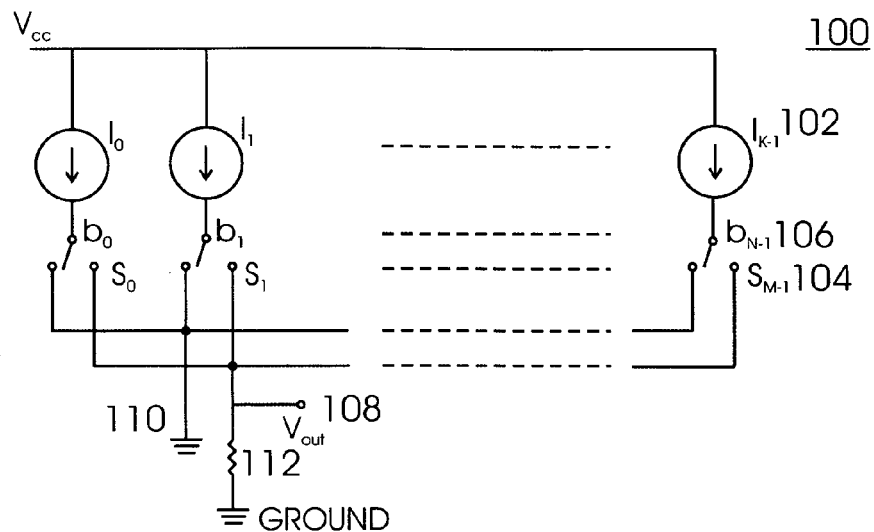
FIG. 1 depicts a conceptual view of a current-steering DAC.
Figure 2:
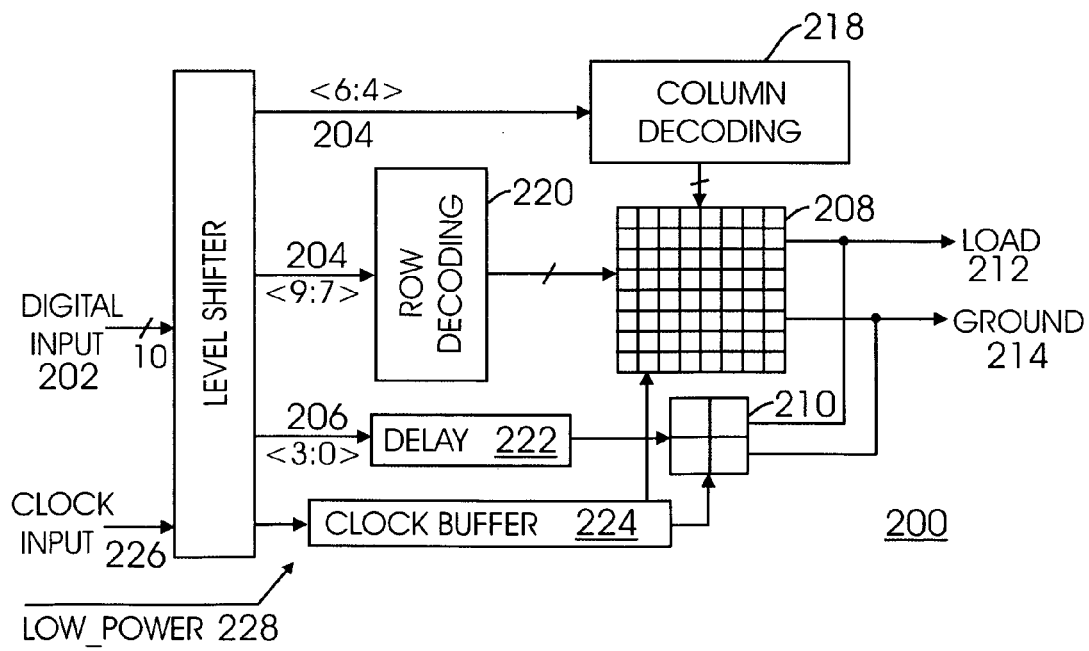
FIG. 2 depicts an embodiment of a 10-bit DAC according to the present invention, having four LSBs that are being converted in accordance with a binary-weighted scheme and six MSBs that are being converted in accordance with a thermometer-coded scheme.

The design of a current-steering DAC may be based a binary-coded architecture, a thermometer-coded architecture, or segmented architecture, which is a combination of these two architectures. FIG. 2 shows a current-steering low-power 10-bit DAC 28 based on a segmented architecture according to one embodiment of the present invention. As shown in FIG. 2, a 10-bit digital input 202 may be converted into its corresponding analog output 212 by converting part of the digital input 202 according to the binary-coded method and remainder of the digital input 202 according to the thermometer-encoded method. Preferably, four LSBs 206 are converted according to the binary-weighted scheme and six MSBs 204 are converted according to the thermometer-encoded scheme. Because a binary-coded DAC may require N scaled-current sources to convert a N-bit digital signal, the design in FIG. 2 may employ four binary-weighted current sources denoted by a matrix 210 of binary-coded current sources to convert four lower-order bits (LSBs) 206. Similarly, because a thermometer-coded DAC may require $2^N-1$ current sources to convert a N bit digital signal, the design in FIG. 2 may employ sixty-four identical current sources denoted by a matrix 208 of thermometer-coded current sources to convert six higher-order bits (MSBs) 204. Each cell in the binary-coded matrix 210 and thermometer-coded matrix 208 may comprise an appropriately scaled current source, circuits for switching currents from the current sources, and other associated circuits such as circuits needed for decoding addresses and buffering against transients or glitches.

In the embodiment shown in FIG. 2, the digital input 202 is first input into a level shifter 216. The shifter 216 provides an interface between the input 202 and the remainder of the circuits comprising the 10-bit DAC 200. In the design in FIG. 2, the six higher-order MSBs 204 are converted according to the thermometer-encoded scheme. Because each input bit in the thermometer-encoded architecture may correspond to more than one current source, the column decoding 218 and row decoding 220 circuits may be needed to establish the correspondence between the MSBs 204 and the current sources in the thermometer-coded matrix 208. The output from the column decoding 218 and row decoding 220 circuits may be input to the matrix of thermometer-coded current sources 208. Based on this decoded input, each current source in the matrix 208 may be connected to either the output load 212 or to ground 214, as will be described further below.

In the embodiment shown in FIG. 2, the lower order bits 206 may be converted according to the binary-coded scheme. Because, in a binary-coded architecture, each input bit in the signal 206 may correspond to one current source in matrix 210, the decoding circuits may be simplified. A delay circuit 222 may be inserted in the path to compensate for the delay associated with the column decoding 218 and row decoding 220 circuits in the path from the level shifter 216 to the thermometer-coded matrix 208. Each bit in the lower order bits 206 may connect its corresponding current source in the matrix 210 to either the output load 212 or to ground 214 depending upon the value in the bit, as will be described further below.

The DAC 200 may also receive an clock that is distributed to various circuits comprising the DAC. In FIG. 2, clock input 226 is distributed to the thermometer-encoded matrix 208 and to the binary-weighted matrix 210 through a clock buffer 224. The clock buffer 224 may ensure that the clock 226 arrives at the appropriate time at various circuits in the DAC 200. The DAC 200 may also receive a LOW_POWER signal 228 that controls whether the DAC 200 operates in a low-power consumption mode. Either LOW_POWER signal 228 or a signal in combination with the LOW_POWER signal 228 may be distributed to each cell of the thermometer-coded matrix 208 or the binary-coded matrix 210 and may affect the operation of the current sources in these matrices.

Although the DAC 200 in FIG. 2 converts a 10-bit signal into an analog signal, other embodiments of the DAC that convert digital signals with greater or fewer bits may be designed. The partition of the input bits between binary-weighted and thermometer-encoded schemes in a particular embodiment may be motivated by design and performance considerations. Accordingly, additional embodiments may be designed by varying the partition of the input digital bits between the binary-weighted or the thermometer-coded architectures.

Figure 3:
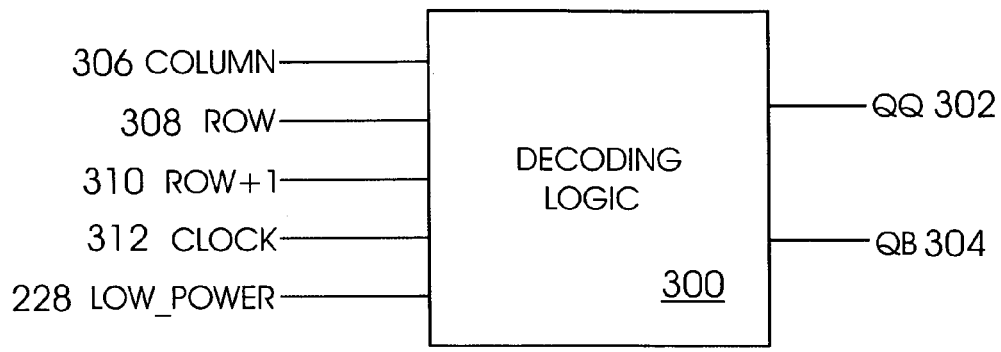
FIG. 3 depicts decoding logic that may be associated with each current source according to the present invention.

FIG. 3 depicts an example of decoding logic that may be associated with the cells of the low-power 10-bit DAC 200 illustrated in FIG. 2. Decoding logic module 300 may accept input signals such as column 306, row 308, row+1 310, clock 312, and LOW_POWER 228. Decoding logic module 300 may produce control signals that control the operation of the current-steering switches associated with current sources. In the embodiment shown in FIG. 3, two control signals QQ 302 and QB 304 are output from module 300. The column 306, row 308, and row+1 310 signals may be provided by the column decoding 218 and row decoding 220 circuits shown in FIG. 2. The LOW_POWER signal 228 controls whether the DAC 200 is operating in the low-power mode or not. The design of the decoding logic module 300 and the signals input to the module 300 may vary from cell to cell and depend upon whether the module 300 is decoding the input signals for a binary-weighted or a thermometer-encoded scheme.

Figure 4:
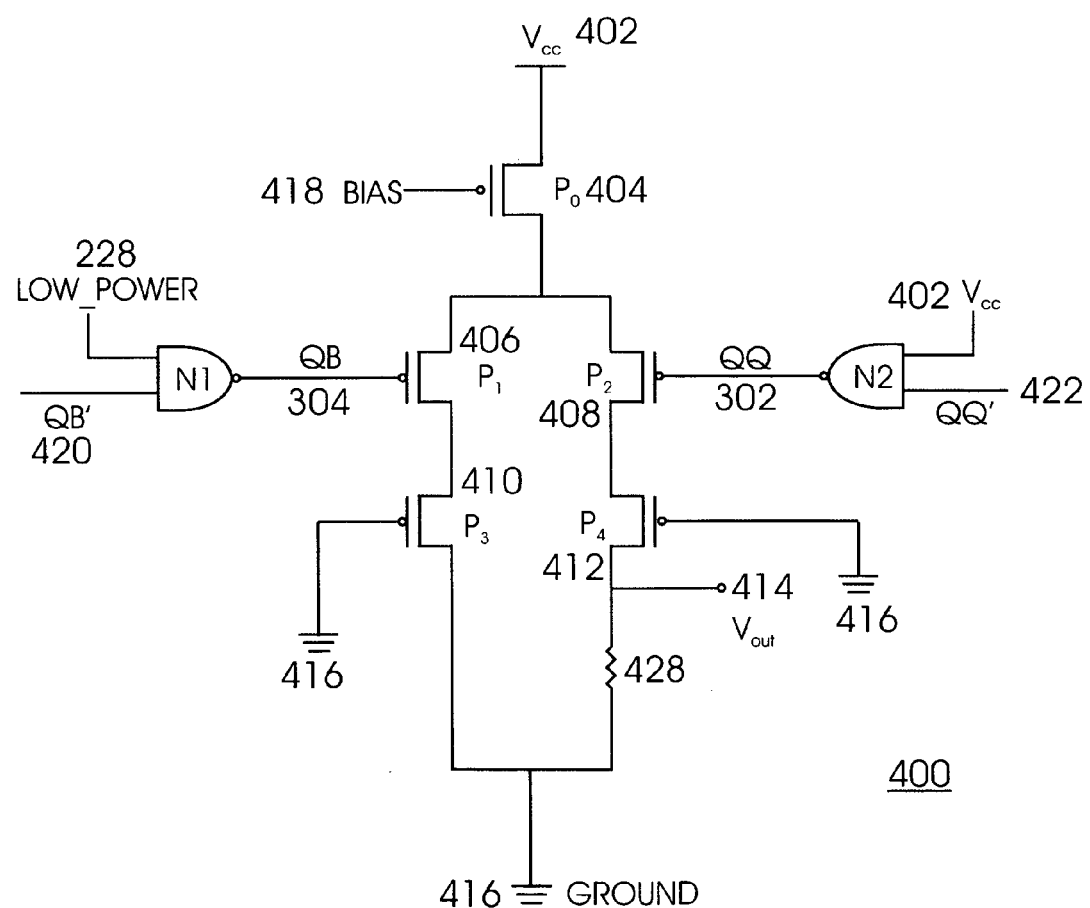
FIG. 4 depicts an element of an embodiment of a DAC according to the present invention, showing a current-steering architecture with a current source, associated switching circuits, and parts of decoding logic.

FIG. 4 illustrates a current source, a portion of a decoding logic module, switching circuits, and buffering circuits. The circuits shown in FIG. 4 may be associated with each cell of the thermometer-coded matrix 208 or the binary-coded matrix 210 of the low-power 10-bit DAC 200 illustrated in FIG. 2. The exemplary circuit shown in FIG. 4 may be substantially considered as a 1-bit low-power DAC. The circuit 400 shown in FIG. 4 may be based on PMOS transistors, which may be employed because of their reduced cross-talk characteristics. In other embodiments, other types of transistors or other switching devices may also be employed.

In the circuit 400 shown in FIG. 4, transistor P0 404 comprises a current source. The source of the transistor P0 404 is connected to voltage $V_{cc}$ 402, and the drain of transistor P0 404 is connected to the sources of two switching transistors P1 406 and P2 408. These switching transistors comprise the current switching mechanism of circuit 400. The transistors P1 406 and P2 408 may be respectively connected in series to transistors P3 410 and P4 412, which may act as buffers to reduce glitch or transient impulses. Use of transistors P3 410 and P4 412 as buffers in circuit 400 is optional. It will be obvious to persons of ordinary skill in the art that other circuits may be employed as buffers or other buffering mechanisms may be employed to alleviate problems associated with sudden changes in voltage and current levels. In FIG. 4, transistor P1 406 is coupled to ground 416 through the buffer transistor P3 410 and transistor P2 408 is couple to load 414 through the buffer transistor 412. However, as mentioned above, use of buffer transistors is optional. Therefore, the term "coupled" embraces both direct coupling and indirect coupling between various components of a circuit. In the embodiment shown in FIG. 4, two NAND gates N1 424 and N2 426 may be included in the circuit 400. The LOW_POWER signal 228 and logic signal QB' 420 are input to the NAND gate N1 424. $V_{cc}$ 402 and logic signal QQ' 422 are input to the NAND gate N2 426. Both QB' 420 and QQ' 422 are signals that may be internal to the decoding logic 30 shown in FIG. 3 and, in some embodiments, may be required to be complementary.

The operation of the circuit 400 illustrated in FIG. 4 will now be described. The gate of current source transistor P0 404 is connected to bias voltage 418. The bias voltage 418 is selected to cause current source transistor P0 404 to operate in a range desirable for a particular application of the DAC. Thus, the level of the bias voltage 418 will depend upon the requirements of the particular embodiment of the circuit 400 being implemented. In the embodiment shown in FIG. 4, gates of transistors P3 410 and P4 412 are connected to ground 416, causing these transistors to always be "on." In other embodiments, gates of transistors P3 410 and P4 412 may be connected to a non-zero voltage so that these transistors may operate in ranges desirable for a particular application of the DAC. The operation of switching transistors P1 406 and P2 408 is respectively controlled by logic signals QB 304 and QQ 302. The switching transistors P1 406 and P2 408 may direct the current output from the current source P0 404 either towards ground 416 through buffer transistor P3 410 or towards the output terminal 414 through the buffer transistor P4 412. When the digital input to the DAC is such that the current source P0 404 should contribute to the output 414, switching transistor P2 408 may be turned "on" to provide a path for the current to output 414 by setting QQ 302 to logic "low." At the same time, switching transistor P1 406 may be turned "off" by setting QB 304 to logic "high" to remove the path to ground 416. Similarly, when, the digital input to the DAC is such that the current source P0 404 should not contribute to the output 414, transistor P2 408 may be turned "off" by setting QQ to logic "high" and transistor P1 406 may be turned "on" by setting QB 304 to logic "low." The decoding logic 300 may be designed to require signals QQ 302 and QB 304 to have complementary values, so that transistor P1 406 and P2 408 are not both "on" at the same time.

In the embodiment shown in FIG. 4, the values of signals QB 304 and QQ 302 are decided respectively by the values at the output of NAND gates N1 424 and N2 426. In this embodiment, one of the inputs of NAND gate N2 426 is connected to $V_{cc}$ 402 causing the NAND gate N2 426 to act as an inverter. The NAND gate N2 426 may be needed to ensure that the signal paths to the switching transistors P1 406 and P2 408 are symmetrical to match the time delays for the signals that control these transistors. In the embodiment shown in FIG. 4, the output of the NAND gate N1 424 depends upon the LOW_POWER signal 228 and the logic signal QB' 420. The LOW_POWER signal 228 may be used to control whether the circuit 400 is operating in a low-power consumption mode. Because the LOW_POWER signal 228 may be distributed to all the cells in the thermometer-coded matrix 208 and the binary-coded matrix 210, this signal may control whether the entire DAC 200 is operating in a low-power consumption mode. The operation of the exemplary circuit 400 when the low-power mode has been disabled is first explained below and then operation of the circuit 400 when the low-power mode has been enabled is explained.

When the LOW_POWER signal 228 is disabled, e.g., set to logic "high", the NAND gate N1 424 will act as an inverter. In this mode, depending upon the values on QQ 302 and QB 304, the current from the current source transistor P0 404 is steered by switching transistors P1 406 and P2 408 either across resistor 428 where a voltage difference may be measured as output, $V_{out}$, or directly to ground 416. Because transistors P1 406 and P2 408 should typically not both be "on" at any instant of time, control signals QB 304 and QQ 302 may be required to be complementary. If so, the signals QB' 420 and QQ' 422 will also be required to be complementary because, when the low-power mode has been disabled, both NAND gates acts are inverters.

When the low-power mode has been disabled in the circuit 400 shown in FIG. 4, the current source P0 404 will in principle always be "on" because the current is being continually "steered" by transistors P1 406 or P2 408. As a result, the total power dissipated by the circuit 400 and in turn by the DAC 200 may be high.

The low-power mode of the embodiment shown in FIG. 4 is now described. When the LOW_POWER signal 228 is enabled, e.g., set to logic "low", QB 304, which is the output of NAND gate N1 424, will be set to logic "high." The switching transistor P1 406 will always be turned off regardless of the value on signal QB' 420, thereby cutting the path from the transistor P0 404 to ground 416 through transistor P3 410. When the value on signal QQ 302 is logic "low," the transistor P2 408 is turned "on" and the current from the current source transistor P0 404 is "steered" to ground 416 through the output load 428. When the value on signal QQ 302 is logic "high," the transistor P2 408 is turned off and the current source transistor P0 404 is not connected to the output terminal 414. In this mode, both switching transistors P1 406 and P2 408 may be turned "off" at the same time. As a result, the current source transistor P0 404 will also be turned "off," as the current no longer has a path to ground. Therefore, less power may be dissipated in the circuit 400 and in turn in the DAC 200. In low-power mode, the dissipated power in may approximately be the power consumed by the output load. In this mode, the DAC 200 may consume less power while still decoding all the input bits 202. Thus, signal QQ' 422 will still control whether the current from P0 404 is being steered to output 414. But signals QQ 302 and QB 304 are not required to be complementary, even in those embodiments in which QQ' 422 and QB' 420 are required to be complementary.

In the embodiments shown in FIG. 4, two NAND gates N1 424 and N2 426 are employed to control switching transistors P1 406 and P2 408. Other logic gates, such as OR, AND, and NOR, may also be employed as substitutes to the NAND gates. Persons of ordinary skill in the art will readily understand how to employ various gates and combinations thereof and accommodate any required changes in polarities of certain signals.

It is possible that in certain embodiments, the operation of the low-power 10-bit DAC 200 in the low-power mode may generate more noise because the current source transistors, such as P0 404 in circuit 400, are being repeatedly turned "off" and "on" as the input digital signal 202 changes. Nevertheless, applications of such embodiments (such as video applications) may tolerate such noise generated in low-power mode. For example, this noise may be concentrated at higher frequencies, allowing it to be removed by a low-pass filter, if needed.

Figure 5:
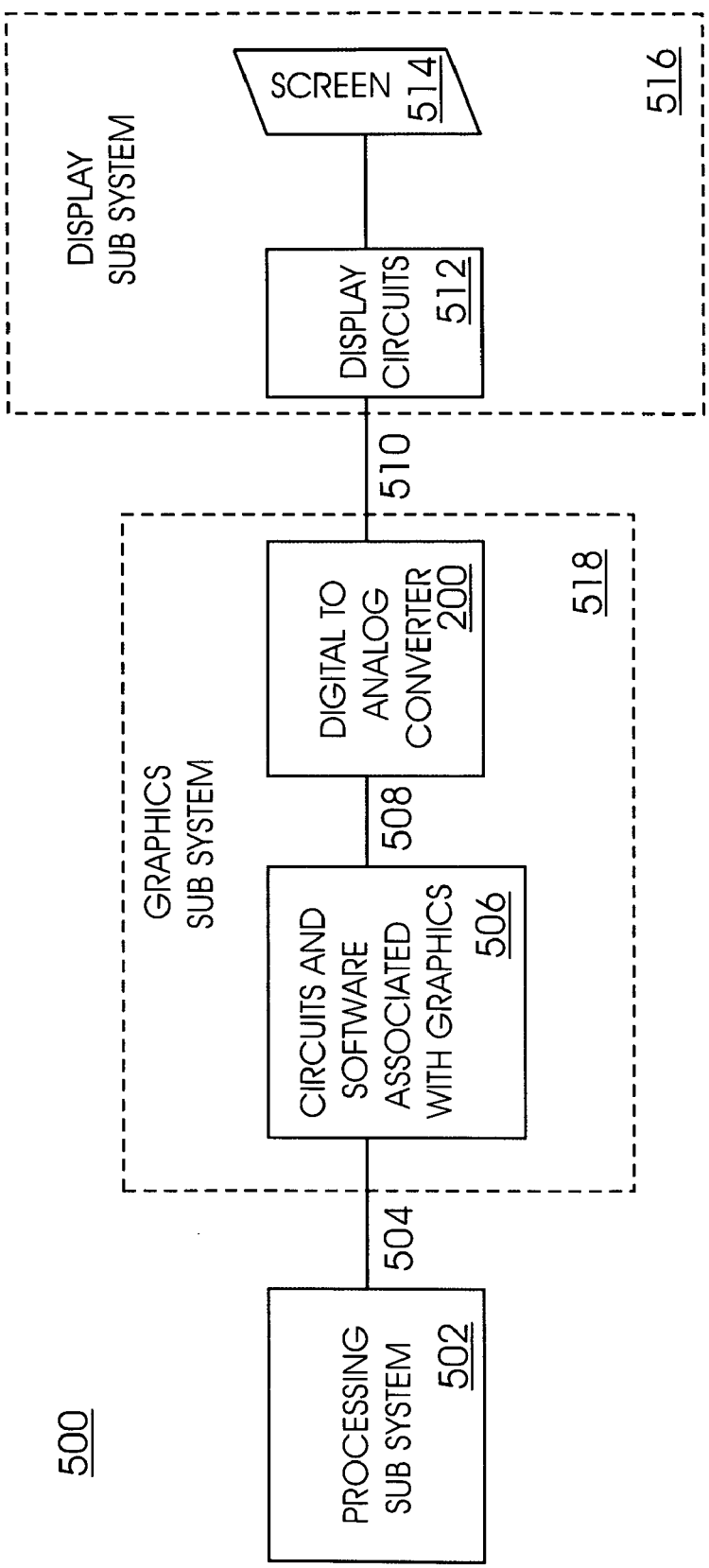
FIG. 5 depicts a block diagram of an exemplary processing subsystem, display subsystem, and graphics subsystem incorporating an embodiment of the invention described herein.

The embodiments of the current-steering DAC 200 capable of operating in a low-power consumption mode described herein may be used with various graphics and imaging devices, such as television monitors, liquid crystal display (LCD) television panels, monitors associated with personal computers, and red-green-blue (RGB) monitors, thereby enabling such devices to operate in a low-power consumption mode. Multiple DAC sets may also be used when the primary (red-green-blue) colors are being decoded separately in a video application. FIG. 5 shows a block diagram of a subsystem 500 incorporating the current-steering DAC 200 described herein. In one embodiment, the graphic subsystem 518 may take input from a processing subsystem 502 and may drive a display subsystem 516. The processing subsystem 502 may include a central processing unit (CPU) or other processor for graphics-related processing. The processing subsystem 502 may be connected to the graphics subsystem 518 through a connection 504. The graphics subsystem 518 may include circuits associated with graphics 506 and an embodiment of the digital DAC 200 illustrated in FIG. 2. Although the subsystem 500 in FIG. 5 shows only one low-power DAC 200, additional DACs designed according to the present invention may be deployed. The circuits associated with graphics 506 may include hardware and software to implement certain graphics techniques or algorithms, frame buffers, and color maps. The circuits associated with graphics 506 may convey a digital data output and digital control signals to the DAC 200 through an electrical connection 508. The control signal may include instructions to the DAC 200 to operate in a low-power consumption mode. The DAC 200 may produce an analog output that is provided to the display subsystem 516 through an electrical connection 510. The display subsystem 516 may include electrical circuits 512 for driving the display monitor 514. The display monitor 514 may be a TV screen, a liquid crystal display unit, or any other kind of display device. Specifics of the processing subsystem 502, graphics subsystem 518, and the display subsystem 516 may depend upon the particular application where these subsystems may be employed.

The value of the LOW_POWER signal 228 may be defined by various mechanisms. In one embodiment, the LOW_POWER signal 228 may be controlled directly by the user. In another embodiment, the LOW_POWER signal 228 may be controlled by a control system such as microcontroller (not shown) in the system. The control system may take as input one or more system parameters, such as heat dissipation during digital to analog conversion, accuracy of digital to analog conversion, speed of digital to analog conversion, or pattern in the input bits to be converted into an analog signal. The LOW_POWER signal 228 may be used to manipulate the operating modes of one or more DACs employed in the system to better suit the overall system requirements such as power consumption, operating speed, conversion accuracy or efficiency. The value of the LOW_POWER signal 228 may be changed dynamically based on the input from the user or from the system while the DAC is operating. If several DACs are being employed in a system, then the LOW_POWER signal 228 to a particular DAC may depend upon one or more factors such as anticipated or actual heat dissipation in the system, need for a higher or lower accuracy output by certain DACs, or the needed speed of conversion by certain DACs. Although the embodiment in FIG. 5 shows only on DAC 200, system requirements of a particular embodiment may necessitate use of multiple DACs.

Although illustrative embodiments have been shown and described in detail, it should be noted and will be appreciated by those skilled in the art that there may be numerous variations and embodiments which may be equivalent to those explicitly shown and described. Unless otherwise specifically stated, the terms and expressions have been used herein as terms and expressions of description, not of limitation. Accordingly, the invention is not to be limited by the specific illustrated and described embodiments and examples (or terms or expressions used to describe them), but only by the scope of the appended claims.

What is claimed is:

1. A digital to an analog converter (DAC) comprising:
   a current source;
   a first logic circuit, wherein the first logic circuit receives a first switching signal and a low-power mode signal, wherein when the low-power mode signal is enabled, the DAC consumes less power than when the low-power mode signal is disabled;
   a first switch controlled by the first logic circuit, wherein the first switch selectively couples the current source to a ground in response to a signal from the first logic circuit; and
   a second switch controlled by a second switching signal, wherein the second switch selectively couples the current source to a load in response to the second switching signal.

2. The DAC of claim 1, wherein the current source comprises a transistor.

3. The DAC of claim 1, wherein the first switch and the second switch each comprise a transistor.

4. The DAC of claim 1, wherein the first switching signal and the second switching signal are based on a digital signal that is being converted into an analog signal.

5. The DAC of claim 1, wherein the first switching signal and the second switching signal are complementary.

6. The DAC of claim 1, wherein the low-power mode signal is selectively enabled or disabled to change the DAC power consumption.

7. The DAC of claim 1, wherein a first buffer circuit couples the first switch to the ground, and wherein a second buffer circuit couples the second switch to the load.

8. A digital to an analog converter (DAC) comprising:
   means for generating a current;
   a first means for selectively switching the current to a ground in response to a first switching signal and a low-power mode signal, wherein when the low-power mode signal is enabled, the DAC consumes less power than when the low-power mode signal is disabled; and
   a second means for selectively switching the current to a load in response to a second switching signal.

9. The DAC of claim 8, wherein the first switching signal and the second switching signal are based on a digital signal that is being converted into an analog signal.

10. The DAC of claim 8, wherein the first switching signal and the second switching signal are complementary.

11. The DAC of claim 8, wherein the low-power mode signal is selectively enabled or disabled to change the DAC power consumption.

12. The DAC of claim 8, wherein the first means is coupled to the ground through a first buffer means, and wherein the second means is coupled to the load through a second buffer means.

13. A method of converting a digital signal into an analog signal using a digital to an analog converter (DAC), the method comprising:
   generating a current;
   selectively switching the current to a ground based on a first switching signal and a low-power mode signal, wherein when the low-power mode signal is enabled, the DAC consumes less power than when the low-power mode signal is disabled; and
   selectively switching the current to a load based on a second switching signal.

14. The method of claim 13, wherein the current is generated using a transistor.

15. The method of claim 13, wherein the first switching signal and the second switching signal are based on the digital signal that is being converted into the analog signal.

16. The method of claim 13, wherein the first switching signal and the second switching signal are complementary.

17. The method of claim 13, further comprising selectively enabling or disabling the low-power mode signal to change the DAC power consumption.

18. The method of claim 13, wherein the selectively switching the current to the ground is performed using a first transistor and the selectively switching the current to the load is performed using a second transistor.

19. The method of claim 18, wherein the first transistor is coupled to the ground through a first buffer circuit, and wherein the second transistor is coupled to the load through a second buffer circuit.

20. The method of claim 19, wherein the first buffer circuit and the second buffer circuit each comprise a transistor.

* * * * *